(12) United States Patent
Yasuda et al.

(10) Patent No.: US 8,155,164 B2
(45) Date of Patent: Apr. 10, 2012

(54) SPREAD FREQUENCY SPECTRUM WAVEFORM GENERATING CIRCUIT

(75) Inventors: Akira Yasuda, Tama (JP); Takashi Kimura, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 778 days.

(21) Appl. No.: 11/238,740

(22) Filed: Sep. 29, 2005

(65) Prior Publication Data

US 2006/0072658 A1  Apr. 6, 2006

(30) Foreign Application Priority Data

Sep. 29, 2004  (JP) ................................. 2004-283909

(51) Int. Cl.
*H04B 1/10* (2006.01)
(52) U.S. Cl. .......................... 375/130; 375/238; 332/109
(58) Field of Classification Search .................. 375/238, 375/130; 370/212; 332/109
See application file for complete search history.

(56) References Cited

U.S. PATENT DOCUMENTS

| | | | | |
|---|---|---|---|---|
| 3,943,446 A * | 3/1976 | Quidort | ......................... | 375/238 |
| 4,063,199 A * | 12/1977 | Oursler, Jr. | ..................... | 332/149 |
| 4,377,779 A * | 3/1983 | Plunkett | ......................... | 318/811 |
| 5,072,354 A * | 12/1991 | Katto et al. | ...................... | 363/41 |
| 5,144,639 A | 9/1992 | Uchida et al. | | |
| 5,615,099 A * | 3/1997 | Nakazawa | ...................... | 363/96 |
| 6,020,773 A | 2/2000 | Kan et al. | | |
| 6,072,361 A * | 6/2000 | Myers et al. | ...................... | 330/10 |
| 6,226,324 B1 * | 5/2001 | Allstrom | ........................ | 375/238 |
| 6,317,457 B1 | 11/2001 | Naruse et al. | | |
| 6,373,340 B1 * | 4/2002 | Shashoua | ....................... | 330/297 |
| 6,487,246 B1 * | 11/2002 | Hoeld | ............................ | 375/238 |
| 6,775,324 B1 | 8/2004 | Mohan et al. | | |
| 6,998,894 B2 * | 2/2006 | Lee et al. | ....................... | 327/172 |
| 7,109,789 B2 * | 9/2006 | Spencer | .......................... | 330/10 |
| 7,142,819 B1 * | 11/2006 | Kang et al. | .................... | 455/63.3 |
| 7,151,404 B2 * | 12/2006 | Lee et al. | ........................ | 330/10 |
| 7,200,173 B2 * | 4/2007 | Ringe et al. | .................... | 375/238 |
| 2004/0189503 A1 * | 9/2004 | Melanson | ....................... | 341/152 |
| 2004/0232978 A1 * | 11/2004 | Easson et al. | .................... | 330/10 |
| 2005/0054307 A1 * | 3/2005 | Watts et al. | ................. | 455/127.3 |
| 2005/0275471 A1 | 12/2005 | Matsunami | | |

FOREIGN PATENT DOCUMENTS

CN  1049760 A  3/1991

OTHER PUBLICATIONS

Chinese Office Action, Chinese Patent Application No. 200580040656.5, issued by State Intellectual Property Office of PRC Jun. 5, 2009; translation prepared and issued by Jeekai & Partners, Beijing, China, received by Applicant for review Jul. 16, 2009.

* cited by examiner

*Primary Examiner* — Jean B Corrielus
(74) *Attorney, Agent, or Firm* — William B. Kempler; Wade J. Brady, III; Frederick J. Telecky, Jr.

(57) ABSTRACT

The objective of this invention is to provide a circuit that generates a spread frequency spectrum waveform with shaped frequency spectrum distribution. The waveform generator has a spread spectrum waveform generating circuit that generates a waveform with a spread spectrum and frequency spectrum distribution shaping circuit that shapes the frequency spectrum distribution of the spread spectrum waveform. In one embodiment, distribution shaping circuit can perform shaping such that the spread spectrum waveform has a frequency spectrum distribution having a spectrum reducing part in at least one band. Also, in one embodiment, the frequency of the spread spectrum waveform can vary periodically or nonperiodically.

10 Claims, 7 Drawing Sheets

SPREAD FREQUENCY SPECTRUM WAVEFORM GENERATING CIRCUIT

The invention relates to a method and apparatus for generating and using a spread spectrum waveform to execute signal conversion or other signal processing.

BACKGROUND

A conventional pulse-width modulator (PWM) circuit, such as used for example in a Class D, is shown schematically in FIG. 21. The PWM circuit comprises an input signal source, a triangular wave generator that generates a triangle wave (or sawtooth wave) as a carrier used for comparison with the input signal received from the input signal source, and a comparator that compares the input signal with the triangle wave to generate a pulse-width modulated (PWM) signal. It is known that the triangle wave generator generates a wave whose frequency varies periodically or whose frequency varies nonperiodically as shown in FIG. 22. FIG. 22 shows a nonperiodic sawtooth wave at (a) and a nonperiodic triangle wave at (b). As shown in FIG. 23, the PWM modulator compares such triangle wave with the received input signal (a) and generates a square wave (b) whose period varies. FIG. 23 also illustrates, at (c) and (d), the frequency spectra of the PWM modulated output signal from the conventional PWM modulator. For the purpose of comparison, FIG. 23(c) shows a PWM modulator using a triangle wave with a fixed period (Conventional Example 1), while FIG. 23(d) shows the PWM modulator of FIG. 21 using a triangle wave whose period varies periodically or nonperiodically (Conventional Example 2).

As shown in the figures, when the triangle wave has a fixed period in Conventional Example 1, the spectrum of the signal is present in the baseband. The discrete spectrum of the carrier as the triangle wave (having the fundamental component of the triangle wave and large peaks at the harmonic frequencies) is present with the sampling frequency fs as the center frequency of the triangle wave. The harmonics of this triangle wave are usually removed by an LC filter arranged after the PWM modulator or a Class D amplifier using the modulator. However, the harmonic components that cannot be removed by the filter are transmitted to the load.

In comparison, for the frequency spectrum diagram shown in FIG. 23, at (d), the spectrum of the signal is similarly present in the baseband, and the noise in the carrier spreads over a wide range from DC to high frequencies as a result of spreading of the spectrum. Therefore, the carrier noise peaks of FIG. 23, at (d), are much smaller than those of FIG. 23, at (c). As a result, the harmonic components of the triangle wave radiated from the wiring connecting the Class D amplifier and the load can affect other circuit blocks when the device is miniaturized, which is a problem.

In the PWM modulator shown in FIG. 21, however, the carrier noise is spread out over a wide range as a result of spectrum spreading. Nevertheless, as shown in FIG. 23, at (d), it is also spread out uniformly in the baseband where the signal is present. Also, there is a notch (that is, a part where the spectrum component decreases) in the frequency spectrum distribution of the carrier noise near the sampling frequency fs.

Consequently, one objective of the present invention is to provide a method and a circuit for generating a spread frequency spectrum waveform with a shaped frequency spectrum distribution.

Another purpose of the present invention is to provide a method and a circuit using the aforementioned spread frequency spectrum waveform to perform signal conversion.

Yet another purpose of the present invention is to provide a transmission method and a device using the aforementioned signal conversion method.

Yet another purpose of the present invention is to provide a method and a circuit using the spread frequency spectrum waveform to perform noise shaping for signal.

Yet another purpose of the present invention is to provide a PWM controller using the spread frequency spectrum waveform with the aforementioned shaped frequency spectrum distribution as the reference signal.

Yet another purpose of the present invention is to provide a Class D amplifier having the aforementioned PWM controller.

SUMMARY

The waveform generating method disclosed in the present invention comprises a step of generating a waveform with a spread spectrum and a step of shaping the frequency spectrum distribution of the aforementioned spread spectrum waveform. In the step of shaping the aforementioned frequency spectrum distribution, the aforementioned spread spectrum waveform can be shaped to have a frequency spectrum distribution having a spectrum component reducing part in at least one band. The frequency of the aforementioned spread spectrum waveform can vary periodically or nonperiodically. Also, the step of generating the aforementioned spread spectrum waveform includes a step of generating a clock and a step of generating a PN code whose frequency varies nonperiodically. The step of shaping the aforementioned frequency spectrum distribution includes a step of conducting a logic operation with the aforementioned clock and PN code to generate the aforementioned spread spectrum waveform. The step of generating the aforementioned spread spectrum waveform can also include a step of dividing the frequency of the aforementioned clock to generate a frequency-divided clock. In the step of generating the aforementioned PN code, the aforementioned frequency-divided clock is used as a clock derived from the aforementioned clock. The EX-OR operation can be conducted in the aforementioned logic operation step.

The signal conversion method disclosed in the present invention is a step of generating a pulse-width modulated signal by pulse-width modulating a reference signal based on a signal. The frequency of the aforementioned reference signal varies periodically or nonperiodically, and the reference signal has a frequency spectrum distribution having a spectrum component reducing part in at least one band. The aforementioned at least one band can include the baseband. Also, the aforementioned pulse-width modulating step includes a step of generating the aforementioned reference signal. The step of generating the aforementioned reference signal includes a step of generating a clock, a step of receiving a clock derived from the aforementioned clock to generate a PN code whose frequency varies nonperiodically, and a step of conducting a logical operation with the aforementioned clock and the PN code to generate the aforementioned reference signal. The step of generating the aforementioned reference signal can also include a step of dividing the frequency of the aforementioned clock to generate a frequency-divided clock. In the step of generating the aforementioned PN code, the aforementioned frequency-divided clock can be used as the clock derived from the aforementioned clock. EX-OR operation can be conducted in the aforementioned logical operation step.

The transmitting method disclosed in the present invention includes a step of converting a signal using the aforementioned signal conversion method to generate a pulse-width modulated signal and a step of transmitting the aforementioned pulse-width modulated signal via a transmission path on the transmitting side and includes a step of processing the aforementioned modulated signal received from the aforementioned transmission line on the receiving side.

The noise-shaping method disclosed in the present invention is characterized by using the aforementioned signal conversion method to shape the frequency spectrum distribution of the noise included in the signal. The aforementioned at least one band includes the baseband. In this way, the noise in the baseband can be reduced.

The waveform generator disclosed in the present invention has a spread spectrum waveform generating circuit that generates a waveform with a spread spectrum and a frequency spectrum distribution shaping circuit that shapes the frequency spectrum distribution of the aforementioned spread spectrum waveform. The aforementioned frequency spectrum distribution shaping circuit can perform shaping such that the aforementioned spread spectrum waveform has a frequency spectrum distribution having a spectrum component reducing part in at least one band. The frequency of the aforementioned spread spectrum waveform can vary periodically or nonperiodically. The aforementioned spread spectrum waveform generating circuit has a clock generator and a PN code generator that receives the clock generated from the aforementioned clock generator to generate the aforementioned PN code. The aforementioned frequency spectrum distribution shaping circuit can have a logic circuit which receives the clock generated from the aforementioned clock generator and the aforementioned PN code, and conducts a logical operation with them to generate the aforementioned spread spectrum waveform with shaped spectrum distribution. The aforementioned spread spectrum waveform generating circuit can include a frequency divider that divides the frequency of the clock generated from the aforementioned clock generator. The aforementioned PN code generator can generate the aforementioned PN code from the aforementioned frequency-divided clock. The aforementioned logic circuit can be an EX-OR gate. Also, the waveform generator of the present invention can have an integrator that integrates the aforementioned spread spectrum waveform generated by the aforementioned logic circuit to generate an analog waveform.

The signal converting circuit disclosed in the present invention is a pulse-width modulator that generates a pulse-width modulated signal by pulse-width modulating a reference signal based on a signal. The frequency of the aforementioned reference signal varies periodically or nonperiodically, and the reference signal has a spectrum component reducing part in at least one band. The aforementioned at least one band can include the baseband. The aforementioned pulse-width modulator includes a reference signal generator. The reference signal generator can include a PN code generator that generates a PN code whose frequency varies periodically or nonperiodically and a frequency spectrum distribution shaping circuit that shapes the frequency spectrum distribution of the aforementioned PN code to generate the aforementioned reference signal.

The transmitter device disclosed in the present invention has a transmitter that converts a signal using the aforementioned signal converting device to generate a pulse-width modulated signal and a receiver that receives the aforementioned pulse-width modulated signal via a transmission path and processes the received pulse-width modulated signal. The aforementioned transmission path can be a wired transmission path. The aforementioned transmission path can be on the same circuit substrate.

The noise-shaping circuit disclosed in the present invention is characterized by using the aforementioned signal conversion circuit to shape the frequency spectrum distribution of the noise included in the signal. The aforementioned at least one band includes the baseband. In this way, the noise in the baseband can be reduced.

The PWM controller disclosed in the present invention is characterized by using a reference signal which has a frequency that varies periodically or nonperiodically and has a frequency spectrum distribution having a spectrum component reducing part in at least one band for comparison with the input signal. The aforementioned at least one band can include the baseband. The aforementioned PWM controller has an input terminal for receiving the aforementioned input signal, a waveform generating circuit which is a reference signal generating signal generating the aforementioned reference signal whose period varies periodically or nonperiodically, and a frequency spectrum distribution shaping circuit that performs shaping so that the frequency spectrum distribution of the aforementioned waveform has a spectrum component reducing part in at least one band to generate the reference signal. The controller can have a pulse-width modulator that spreads the spectrum of the aforementioned input signal and generates a PWM modulation output signal having a spectrum component reducing part in the aforementioned at least one band by PWM modulating the aforementioned reference signal based on the aforementioned input signal received at the aforementioned input terminal. The aforementioned input signals are first and second differential signals. The aforementioned pulse-width modulator has first and second pulse-width modulator parts. The aforementioned first pulse-width modulator part receives the aforementioned first differential input signal and generates a first differential PWM modulation output signal. The aforementioned second pulse-width modulator part receives the aforementioned second differential input signal and generates a second differential PWM modulation output signal. The first and second differential PWM modulation output signals can form the differential output signal. Or, the aforementioned waveform generating circuit has a clock generator and a PN code generator that receives the clock generated from the clock generator to generate a PN code. The aforementioned frequency spectrum distribution shaping circuit can have a logic circuit that receives the clock generated from the aforementioned clock generator and the PN code and conducts a logical operation with them to generate the aforementioned reference signal. The aforementioned waveform generating circuit can include a frequency divider that divides the frequency of the clock generated from the aforementioned clock generator. The clock from the aforementioned clock generator received by the aforementioned PN code generator can be the clock generated by the aforementioned frequency divider. The aforementioned logic circuit can be an EX-OR gate. Also, the PWM controller of the present invention can have an integrator that integrates the aforementioned reference signal generated by the aforementioned logic circuit. In this way, an analog reference signal can be generated. The aforementioned reference signal can have a frequency range wherein the frequency varies. The aforementioned pulse-width modulator has a filter having an input and an output and a comparator having two inputs. The aforementioned filter receives the aforementioned input signal at its input, filters the input signal, and sends it to the aforementioned output. The aforementioned comparator receives the aforementioned filtered signal at one of the aforementioned inputs and receives the aforementioned reference signal at the other input. The aforementioned pulse-width modulator can have a feedback circuit. The input of the feedback circuit is connected to a first point in the aforementioned pulse-width modulator, and its output is connected to a second point in the aforementioned pulse-width modulator to supply the feedback signal. Also, the PWM controller can include a output section receiving the aforementioned PWM modulated signal. The input of the aforementioned feedback circuit can be connected to the output of the output of the aforementioned comparator or to the aforementioned output section. The feedback circuit can have an adder. The adder has two inputs and one output. One of the inputs receives the aforementioned input signal, while the other input receives the aforementioned feedback signal. The output is connected to the input of the aforementioned filter. The aforementioned pulse-width modulator has an adder with two inputs and one output, a filter with an input and an output, and a comparator with one input. The aforementioned adder receives the aforementioned input signal at one of its inputs and receives the aforementioned reference signal at the other input. The input of the aforementioned filter is connected to the output of the adder. The input of the aforementioned comparator is connected to the output of the filter. The output from the filter is compared with a threshold value to generate the aforementioned pulse-width modulated signal. The aforementioned pulse-width modulator has a feedback circuit. The input of the feedback circuit is connected to a first point in the aforementioned pulse-width modulator, and its output is connected to a second point in the aforementioned pulse-width modulator to supply the feedback signal. The aforementioned PWM controller can also include an output section receiving the aforementioned PWM modulated signal. The input of the aforementioned feedback circuit can be connected to the output of the comparator or to the output of the aforementioned output section. The aforementioned feedback circuit has an adder. The adder can add the aforementioned feedback signal to the aforementioned input signal and the aforementioned reference signal. The aforementioned filter can be an integrator. The aforementioned adder and filter of the aforementioned pulse-width modulator can have plural adder/filter sections. Each of the adder/filter sections can receive the aforementioned input signal and the aforementioned reference signal as inputs. The aforementioned pulse-width modulator has a feedback circuit. The input of the feedback circuit is connected to a first point in the aforementioned pulse-width modulator, and its output is connected to the input of each of the aforementioned adder/filter sections to supply a feedback signal. Also, the PWM controller of the present invention can have a first group of coefficient circuits that determines the ratio of the aforementioned input signals supplied to each of the aforementioned plural adder/filter sections, a second group of coefficient circuits that determines the ratio of the aforementioned reference signals supplied to each of the aforementioned plural adder/filter sections, and a second group of coefficient circuits that determines the ratio of the aforementioned feedback signal supplied to each of the aforementioned plural adder/filter sections.

The Class D amplifier disclosed in the present invention has the aforementioned PWM controller.

DESCRIPTION OF THE EMBODIMENTS

According to the present invention, a spread frequency spectrum waveform with shaped frequency spectrum distribution can be generated. In this way, the frequency spectrum distribution of the noise can be spread out, and it is possible to form a spectrum component reducing part or a notch in a desired band, such as the baseband, in the frequency spectrum of the noise. Consequently, there is the need to use the filters, etc., used in the conventional technology to reduce the undesired radiation component. The device can be miniaturized, and the cost can be cut. Also, according to the present invention, signal conversion, such as PWM modulation or D-grade amplification, can be performed using the spread frequency spectrum waveform. In addition, according to the present invention, transmission can be performed using the aforementioned signal conversion method.

In the following, various embodiments of the present invention are explained in detail with reference to the figures.

Figure 1:
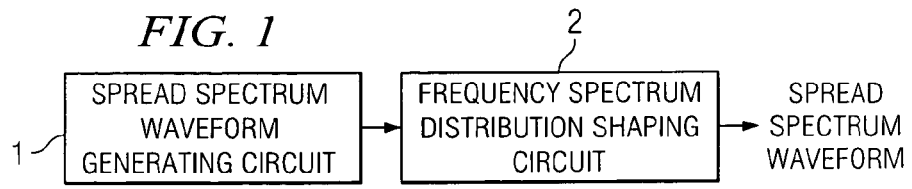
FIG. 1 is a block diagram illustrating the waveform generator disclosed in an embodiment of the present invention.
Figure 23:
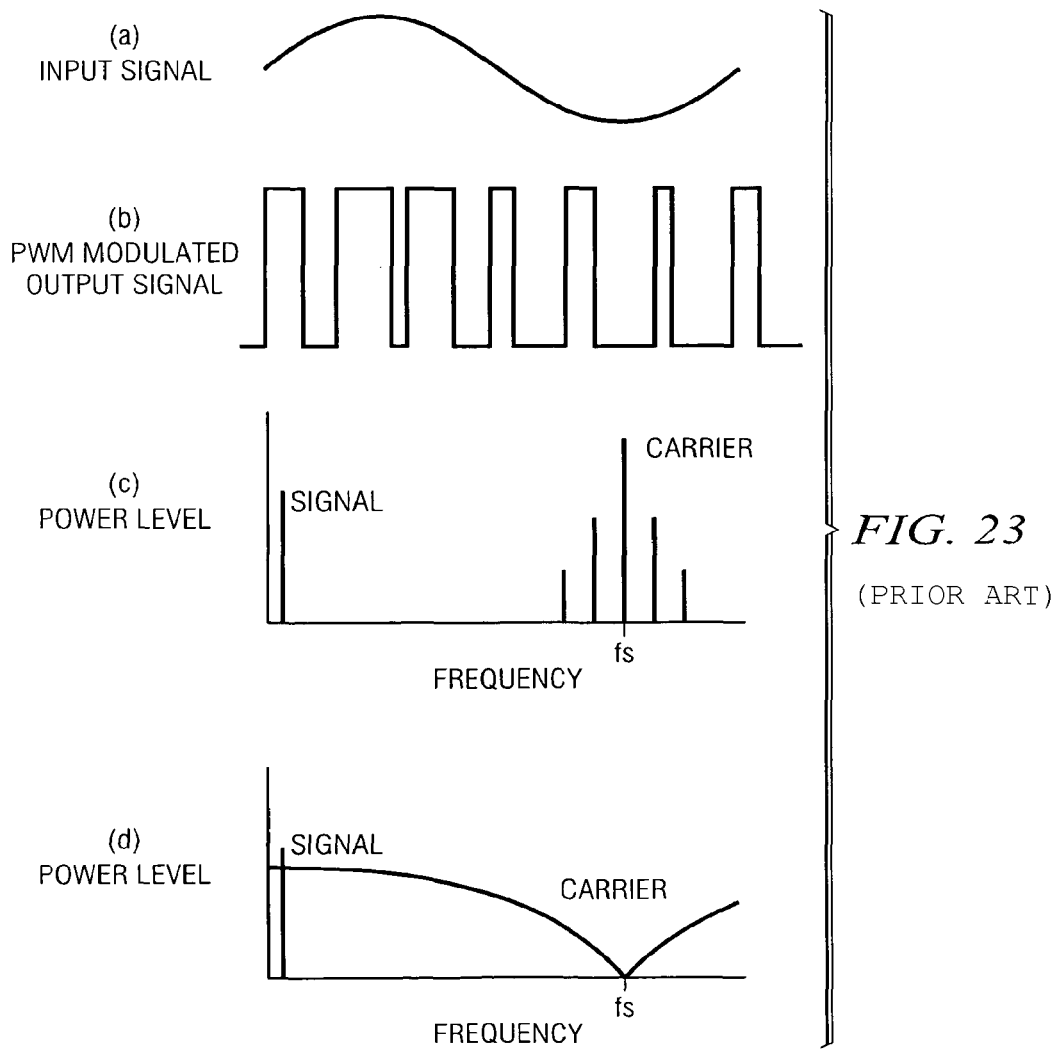
FIG. 23 is a diagram illustrating the waveform of the conventional pulse-width modulator, the frequency spectrum of a conventional PWM modulator using a triangle wave with fixed frequency, and the frequency spectrum of a conventional PWM modulator using a triangular with varying frequency.

FIG. 1 shows waveform generator X according to an embodiment of the present invention. Said waveform generator X has spread spectrum waveform generating circuit 1 and frequency spectrum distribution shaping circuit 2. Spread spectrum waveform generating circuit 1 can generate a waveform with a spread frequency spectrum. It generates a waveform with its frequency varying nonperiodically or periodically, for example, in a certain frequency range. The spread frequency spectrum waveform in effect has frequency spectrum components distributed over a wide range. In this way, it is possible to avoid concentration of frequency spectrum components at or in a specific frequency or frequency band. An example of the circuit generating waveform with its frequency varying nonperiodically is PN code generator (an example of the circuit generating waveform with its frequency varying periodically is multivibrator or other oscillator circuit). After receiving the generated spread spectrum waveform, said frequency spectrum distribution shaping circuit 2 operates to shape the distribution of the frequency spectrum components of the spread spectrum waveform. For example, a spectrum component reducing part or a notch can be present in at least one band by shaping the frequency spectrum distribution of the spread spectrum waveform. When the spectrum component reducing part or the notch is formed in the band where signal is present, the influence of the spread frequency spectrum waveform on the signal in that band can be reduced or effectively eliminated. For example, as shown in FIG. 23(d), when the signal band is the baseband, the noise component in the baseband can be reduced. Also, when the signal band is a frequency band other than the baseband, if there are other signals present in that frequency band, the influence on the other signals can be reduced or effectively eliminated. Usually, a square wave with a certain period has a spectrum component with frequency 1/Tc determined by its period Tc as well as a large component with a frequency that is an integer multiple of 1/Tc. When the large spectrum component is at or near to the carrier frequency or intermediate frequency of various types of wireless communication systems, such as AM broadcasting system, these systems will be greatly affected. According to the present invention, said influence can be reduced or effectively removed.

In the following, signal converting circuit Y based on an embodiment of the present invention is explained with reference to FIG. 2. The signal converting circuit Y uses waveform generator X shown in FIG. 1. As shown in the figure, signal converting circuit Y has reference signal generator 3, pulse-width modulator (PWM modulator) 4, input terminal 5 receiving the input signal, and input terminal 6 receiving the reference signal from reference signal generator 3. Pulse-width modulator 4 generates a pulse-width modulated signal at output terminal 7 by pulse-width modulating the reference signal received at input terminal 6 depending on the input signal received at input terminal 5. More specifically, reference signal generator 3 is the same as waveform generator X shown in FIG. 1 and has spread spectrum waveform generating circuit 1 and frequency spectrum distribution shaping circuit 2. Consequently, the reference signal generated by generator 3 is a spread spectrum waveform and has its frequency spectrum distribution adjusted. When this reference signal is used as a signal for comparison with the input signal, the PWM modulated signal generated by PWM modulator 4 includes a spectrum component of the signal in the baseband, and the frequency spectrum of the reference signal is spread over a wide range and has a notch in the baseband. In this way, the spreading of the frequency spectrum and noise reduction in the baseband can be realized at the same time.

Figure 2:
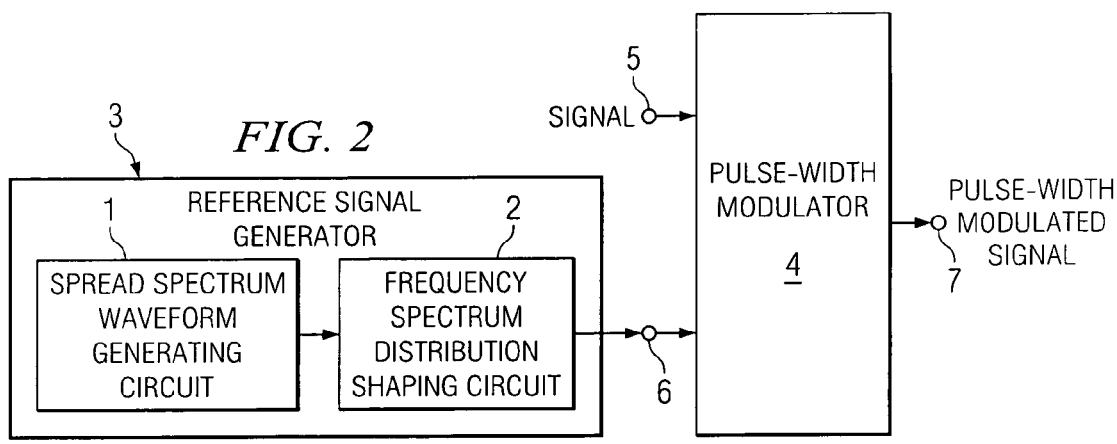
FIG. 2 is a block diagram illustrating the signal converting circuit disclosed in an embodiment of the present invention.

In the signal converting circuit Y shown in FIG. 2, since the noise in the baseband is also reduced as described above, shaping of the frequency spectrum distribution according to the present invention also has a noise-shaping function. Consequently, the signal converting circuit Y shown in FIG. 2 can also be used as a noise-shaping circuit.

Figure 3:
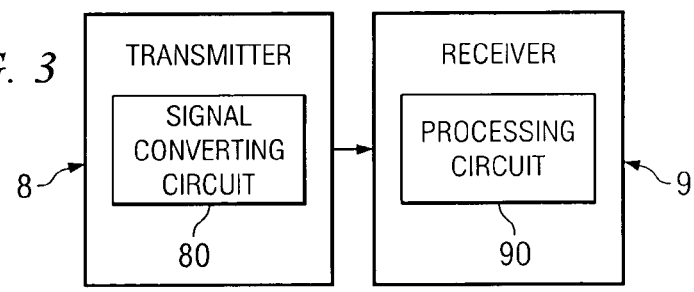
FIG. 3 is a block diagram illustrating the transmitting device disclosed in an embodiment of the present invention.

In the following, transmission device Z disclosed in an embodiment of the present invention will be explained with reference to FIG. 3. As shown in the figure, said transmission device Z has transmitter 8 and receiver 9, which are connected to each other in a transmission path. Transmitter 8 has signal converting circuit 80, which has the same circuit configuration as that shown in FIG. 2. The signal to be sent is converted into a PWM modulated signal by means of pulse-width modulation. Receiver 9 has a signal processing circuit 90 that can demodulate the PWM modulated signal and conduct the desired signal processing after receiving the converted signal via the transmission path. When said transmission device Z of the present invention is used, since the frequency spectrum is spread as described above for the PWM modulated signal transmitted by the transmission path, the influence on the ambient circuit can be reduced. Also, since the PWM modulated signal can shape the frequency spectrum distribution, the frequency spectrum component in the selected band can be further reduced. In this way, the level of noise in the band that particularly affects adjacent circuits can be further reduced. When this transmission device is embodied in the same circuit substrate, such as IC chip, substrate, or board, the influence on adjacent circuits can be minimized.

Figure 4:
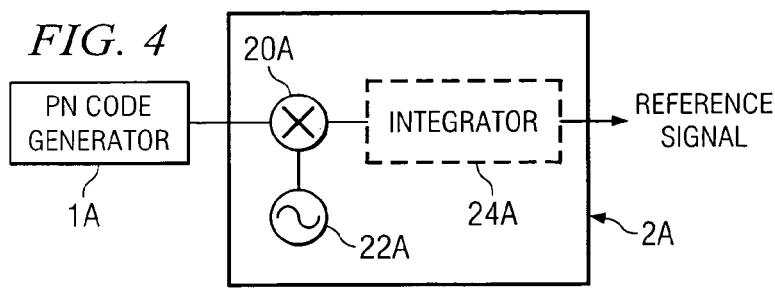
FIG. 4 is a block diagram illustrating a reference signal generator of an embodiment that further embodies the reference signal generator shown in FIG. 2.

In the following, reference signal generator A as an embodiment of reference signal generator 3 shown in FIG. 2 will be explained with reference to FIG. 4. "A" is appended to the same symbols to represent the elements corresponding to those shown in FIG. 2. As shown in the figure, reference signal generator A has PN code generator 1A, converter 20A used as spectrum distribution shaping circuit 2A, and signal source 22A. If necessary, reference signal generator A may also have integrator 24A. More specifically, PN code generator 1A has a conventional circuit configuration and generates a PN code which is a square wave whose period varies pseudo-randomly. The PN code is white noise with a spread frequency spectrum. On the other hand, signal source 22A generates the signal used for shaping the frequency spectrum of the PN code. Converter 20A receiving said PN code and the signal of signal source 22A at its two inputs generates the conversion result at the output. The output is a square wave. Integrator 24A integrates the square wave to convert it into a triangle wave or a sawtooth wave. The integrator can be used when the PWM modulator uses a triangle wave or a sawtooth wave instead of a square wave as the reference signal.

In the following, reference signal generator B in an embodiment that further embodies the reference signal generator shown in FIG. 4 will be explained with reference to FIG. 5. "B" is appended to the same symbols to represent the elements corresponding to those shown in FIG. 4. As shown in the figure, reference signal generator B has clock generator

10B as PN code generator 1B and PN code generator 12B. It also has exclusive OR (EX-OR) gate 20B as spectrum distribution shaping circuit 2B. More specifically, clock generator 10B generates a clock that determines the reference period of the PN code. PN code generator 12B receives the clock and generates PN code by randomly generating a square wave having a period that is an integer multiple of the period of the clock. The PN code is random signal. It is white noise whose spectrum has an almost constant value independent of the frequency. Consequently, the high-frequency component becomes white noise. The power at that frequency is low. In this way, the influence on a system using RF signals, such as radio, can be minimized. EX-OR gate 20B receives the PN code at one input and the clock from clock generator 10B at the other input. It outputs the result of the exclusive-OR operation. In this case, clock generator 10B can also act as part of spectrum distribution shaping circuit 2B.

Figure 5:
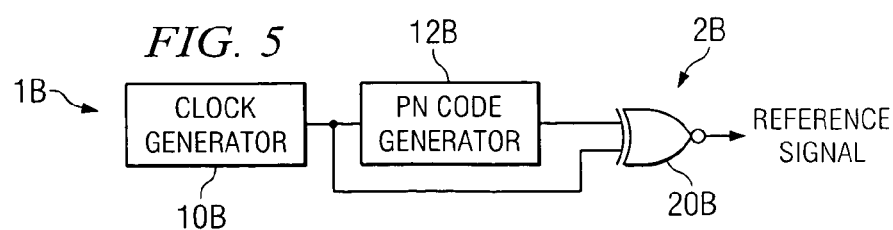
FIG. 5 is a block diagram illustrating a reference signal generator of an embodiment that further embodies the reference signal generator shown in FIG. 4.
Figure 6:
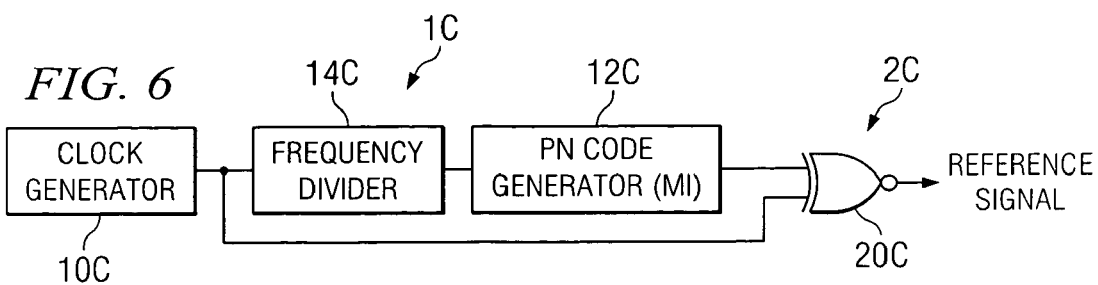
FIG. 6 is a block diagram illustrating a reference signal generator of an embodiment that modifies the reference signal generator shown in FIG. 5.

FIG. 6 shows a reference signal generator of an embodiment that modifies reference signal generator B shown in FIG. 5. "C" is appended to the same symbols to represent the elements corresponding to those shown in FIG. 5. Like the reference signal generator shown in FIG. 5, the reference signal generator C shown in FIG. 6 has clock generator 10C, PN code generator 12C, and EX-OR gate 20C. The difference is that frequency divider 14C (frequency-dividing ratio M1) is connected between clock generator 10C and PN code generator 12C. Frequency divider 14C divides the frequency of the clock sent from the clock generator to 1/M1 and supplies the result to PN code generator 12C. The frequency dividing can increase the reference period of the PN code and thus reduce the reference frequency. Consequently, compared with the one shown in FIG. 5, EX-OR gate 20C receives a clock with shorter period (therefore, higher frequency) than the reference period of PN code. Frequency divider 14C can compress the frequency spectrum distribution of the reference signal in the direction of the frequency axis. As frequency dividing ratio M1 is increased, the frequency spectrum distribution is compressed more toward the low-frequency side. In this embodiment of the present invention, a characteristic having a notch near DC and low-frequency region can be realized, and the noise level near DC can be further reduced. Consequently, in a Class D amplifier constituted with the PWM modulator using this reference signal generator, a high SNR can be maintained without adding noise to the frequency component of the input signal. On the other hand, the high-frequency component is white noise, and the power at this frequency is reduced. Consequently, the influence on a system using RF signals, such as radio, can be minimized.

Figure 7:
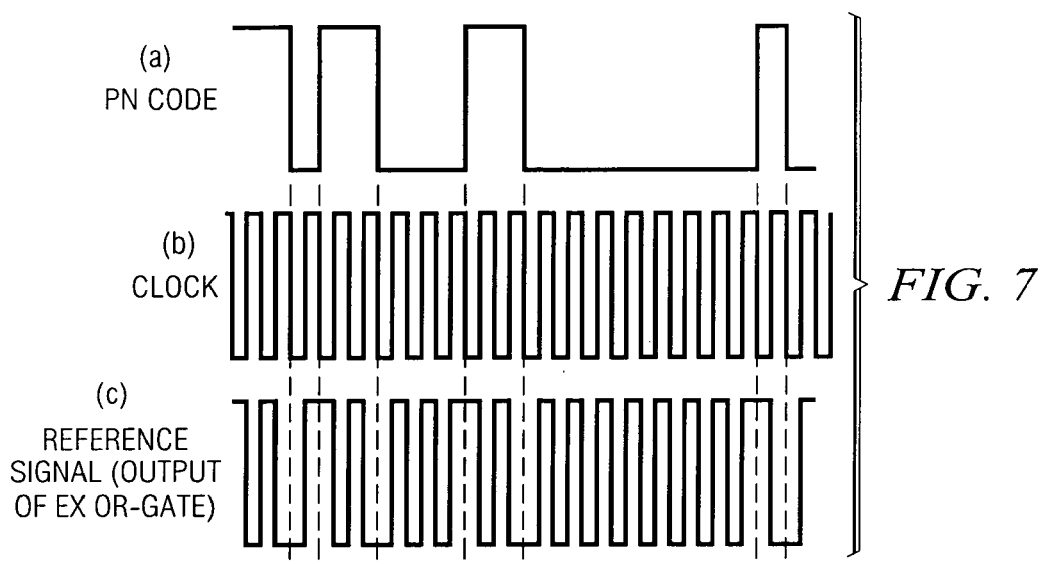
FIG. 7 is a waveform diagram explaining the operations of the reference signal generators shown in FIGS. 5 and 6.

In the following, the operation of reference signal generators B and C shown in FIGS. 5 and 6 will be explained based on FIGS. 7 and 8. FIG. 7(*a*) shows the PN code generated by PN code generator 12B or PN code generator 12C. FIG. 7(*b*) shows the clock generated by clock generator 10B or clock generator 10C. FIG. 7(*c*) shows the reference signal as the result of exclusive-OR operation of the PN code and the clock. The exclusive-OR operation divides the period of the PN code by the period of the clock. In this way, the frequency spectrum distribution of the PN code is shifted by as much as the clock frequency on the frequency axis.

Figure 8:
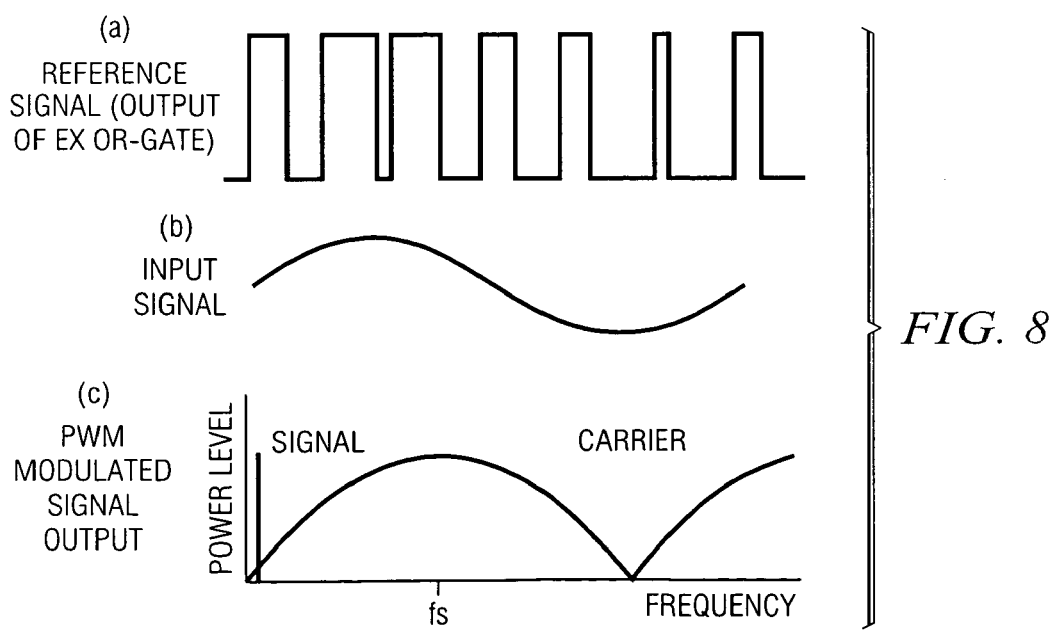
FIG. 8 is a waveform diagram and a frequency spectrum diagram explaining the operations of the reference signal generators shown in FIGS. 5 and 6.

FIG. 8 shows the frequency spectrum of the PWM modulated signal output when PWM modulation is performed using the reference signal generated as described above. That is, FIG. 8(*a*) shows the reference signal generated by EX-OR gate shown in FIG. 7(*c*), FIG. 8(*b*) shows the input signal (a sinusoidal signal in the figure), and FIG. 8(*c*) shows the frequency spectrum of the PWM modulated signal output. As shown in FIG. 8(*c*), the frequency spectrum distribution of the carrier, that is, the reference signal, is shifted to the high=frequency side. The amount of shift is frequency fs equivalent to the frequency of the clock, as can be from the comparison with FIG. 23(*c*). As a result of this shift, the notch is positioned close to DC, and the noise component in the baseband is reduced. In this way, in the Class D amplifier using the PWM modulator of the present invention, a high SNR can be maintained while adding virtually no noise to the frequency component of the input signal. On the other hand, the high-frequency component becomes white noise, and the power for this frequency is reduced. Consequently, the influence on a system using RF signals, such as radio, can be minimized.

Figure 9A:
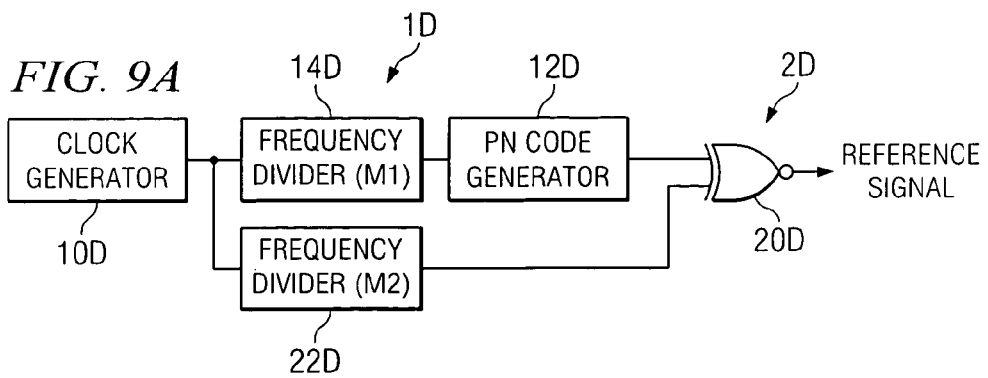
FIG. 9A is a block diagram illustrating reference signal generator D of another embodiment.

In the following, reference signal generator D of another embodiment will be explained based on FIG. 9A. "D" is appended to the same symbols to represent the elements corresponding to those shown in FIG. 6. The difference between reference signal generator D and the reference signal generator shown in FIG. 6 is that a frequency divider 22D is set between the output of clock generator 10D and one input of EX-OR gate 20D as a part of frequency spectrum distribution shaping circuit 2C. The rest of the configuration, that is, clock generator 10D, frequency divider 14D, and PN code generator 12D, is the same. More specifically, frequency divider 22D multiplies the frequency of the clock sent from clock generator 10D by 1/M2 and sends the output to the input of EX-OR gate 20D. Said frequency divider 22D can shift the frequency spectrum distribution of the reference signal along the frequency axis. In this embodiment, the clock frequency (constituting the reference period) of the PN code generator and the frequency of the output reference signal can be set to any ratio by setting the frequency dividing ratios M1 and M2. The position of the notch in the reference signal can be controlled by changing this ratio.

Figure 9B:
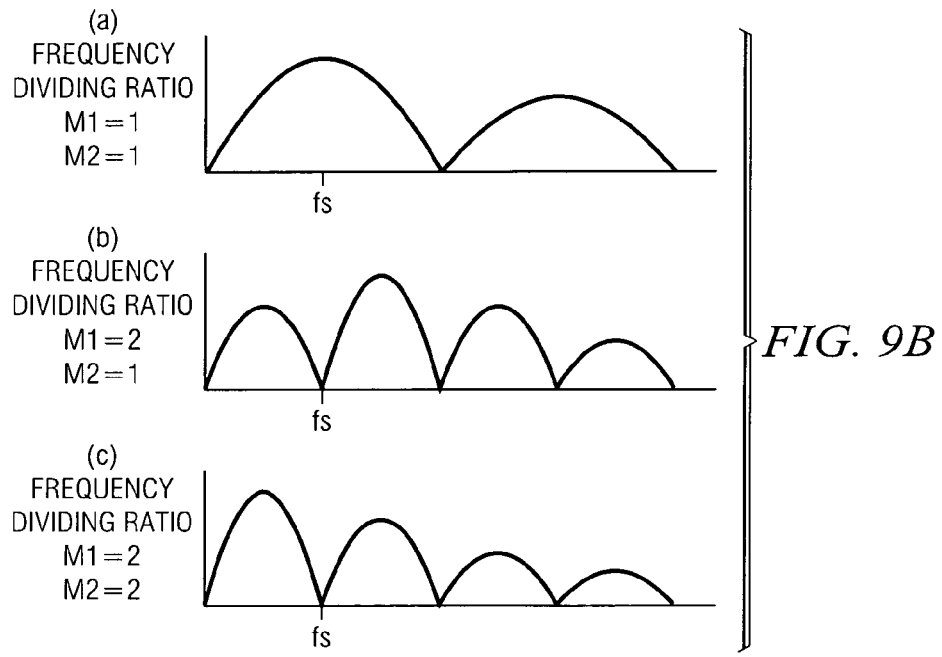
FIG. 9B is a frequency spectrum diagram explaining the operation of the reference signal generator shown in FIG. 9.

In the following, the operation of the circuit shown in FIG. 9A will be explained based on the frequency spectrum diagram of the reference signal shown in FIG. 9B. In FIG. 9B, (a) shows the case when frequency dividing ratio M1=1, M2=1, that is, the frequency spectrum distribution being equivalent to reference signal generator B shown in FIG. 5 (this is the same as that shown in FIG. 8 at (c)). In this state, when the frequency dividing ratio M1 is changed to 2, as shown in (b) of FIG. 9A, the frequency spectrum distribution is compressed by ½ in the direction of the frequency axis as described above. In this state, when the frequency dividing ratio M2 is changed to 2, as shown in (c) of FIG. 9B, the frequency spectrum distribution is shifted by fs on the frequency axis. In the embodiment shown in FIG. 9A, the position of the notch can be determined more precisely.

Figure 10:
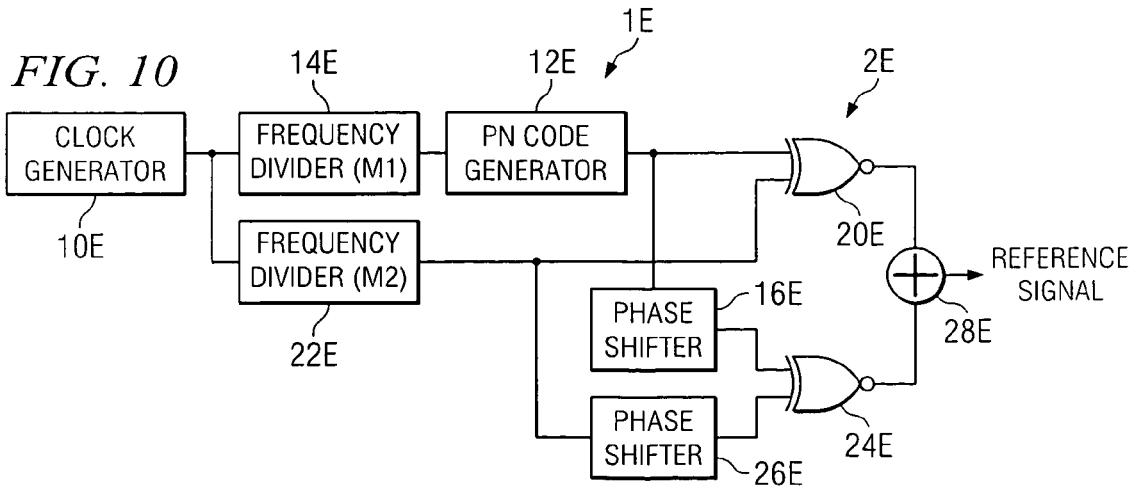
FIG. 10 is a block diagram illustrating a reference signal generator of yet another embodiment.

In the following, reference signal generator E of yet another embodiment will be explained based on FIG. 10. "E" is appended to the same symbols to represent the elements corresponding to those shown in FIG. 9A. The difference between reference signal generator E and the reference signal generator shown in FIG. 9A is that two phase shifters 16E and 26E as well as EX-OR gate 24E and OR gate 28E are added. The rest of the configuration, that is, clock generator 10E, frequency divider 14E, PN code generator 12E, frequency divider 22E, and EX-OR gate 20E, is the same. More specifically, in this embodiment, phase shifters 16E and 26E shift the phases of the output of the PN code generator and the output of frequency divider 22E. The exclusive logical sum of the outputs is calculated by EX-OR gate 24E. An OR operation is performed on this exclusive logical sum output and the exclusive logical sum output of EX-OR gate 20E to generate the reference signal. In other words, a phase-rotated signal is formed by means of phase shifting, and that signal can be used to cancel the component generated by frequency conversion in the negative direction (such as f1−f2) or positive direction (such as f1+f2) occurring during frequency conversion. It is a well-known fact that when signals with, for example, frequencies f1 and f2 are multiplied, signals of two frequencies, that is, f1+f2 and f1−f2 are generated. Then, in a normal balance modulator, a signal with phase shifted by 90° can be used to output either f1+f2 or f1−f2. In this embodiment, phase shifters 16E, 26E and EX-OR gate 24E are used to output only one component ((f1−f2) or (f1+f2)) which is used for OR operation. In this way, the noise component can be further reduced. Consequently, in this embodiment, the noise at the notch set depending on M1 and M2 can be further reduced.

Figure 11:
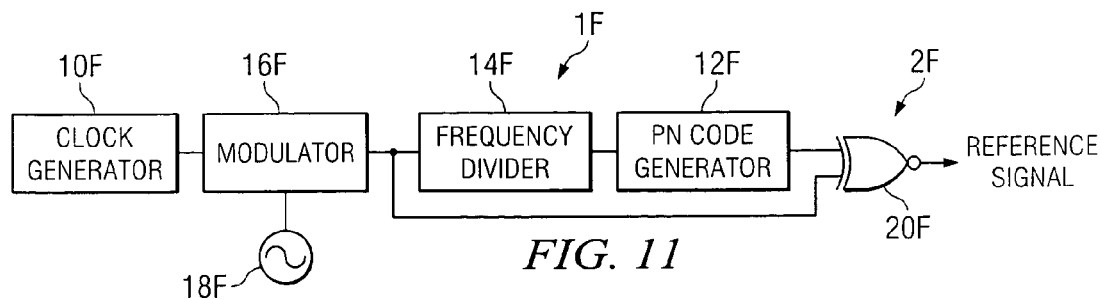
FIG. 11 is a block diagram illustrating a reference signal generator of yet another embodiment.

In the following, the reference signal generator of yet another embodiment will be explained with reference to FIG. 11. "F" is appended to the same symbols to represent the elements corresponding to those shown in FIG. 6. The difference between reference signal generator F and the reference signal generator shown in FIG. 6 is that modulator 16F and signal source 18F are added. The rest of the configuration, that is, clock generator 10F, frequency divider 14F, PN code generator 12F and EX-OR gate 20F, is the same. More specifically, modulator 16F frequency-modulates or phase-modulates the clock sent from clock generator 10F based on the signal sent from signal source 18F (frequency modulation or phase modulation can spread the frequency component). In this way, the frequency of the clock input to the frequency divider and then to the PN code generator varies. By adopting this configuration, the extent of spectrum spreading can be further increased. In this way, the noise peaks can be further reduced.

The reference signal generators shown in FIGS. 5, 6, 9A, 10, 11 generate square waves as output. When a triangle wave is needed, as shown in FIG. 4, an integrator can be added to the reference signal generator. However, if only an integrator is added, the amplitude of the triangle wave will vary depending on the period of the square wave.

Figure 12:
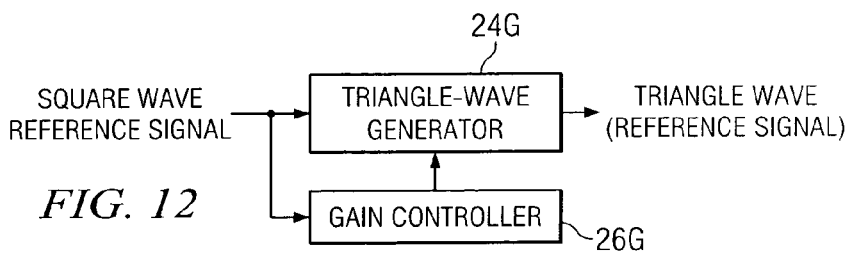
FIG. 12 is a block diagram illustrating a reference signal generator of an embodiment that generates a triangle-wave reference signal having a fixed amplitude.

In the following, reference signal generator G of an embodiment that can generate a reference signal in the form of a triangle wave with a fixed amplitude will be explained based on FIG. 12. "G" is appended to the same symbols to represent the elements corresponding to those shown in FIGS. 4 and 5. As shown in the figure, reference signal generator G has a triangle wave generator 24G that receives the square-wave reference signal from each reference signal generator shown in FIGS. 5, 6, 9A, 10, 11 and a gain controller 26G. Gain controller 26G generates gain depending on the period of the received square wave. Said triangle wave generator 24G receiving the gain has an internal integrator which integrates the square wave corresponding to the gain output from gain controller 26G to generate a triangle wave with a fixed amplitude.

Figure 13:
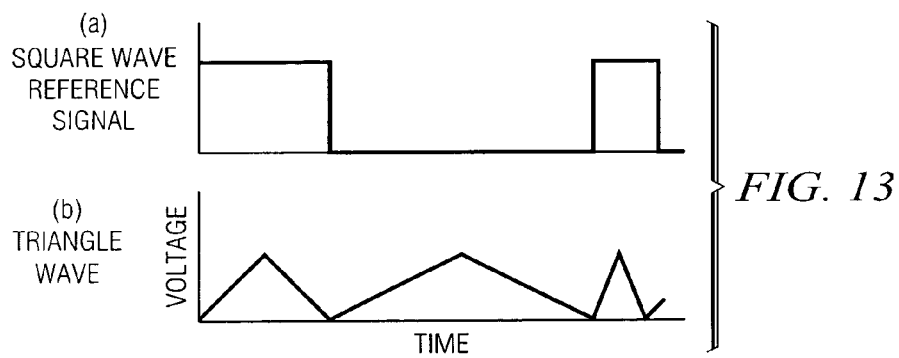
FIG. 13 is a waveform diagram explaining the operation of the reference signal generator shown in FIG. 12.

FIG. 13, at (a), shows the waveform of the square-wave reference signal received by triangle wave generator 24G. FIG. 13, at (b), shows the triangle wave with a fixed amplitude generated from the square wave. The triangle wave with fixed amplitude generated by reference signal generator G shown in FIG. 12 can be used as a triangle wave for PWM modulation.

Figure 14:
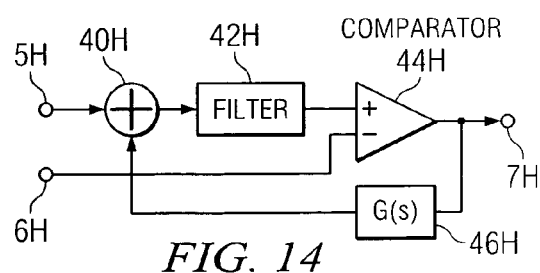
FIG. 14 is a circuit diagram illustrating a PWM controller of an embodiment that further embodies the reference signal generator shown in FIG. 2.

In the following, PWM controller H of an embodiment that further embodies the signal converting circuit shown in FIG. 2 will be explained based on FIG. 14. In FIG. 14, "H" is appended to the same symbols to represent the elements corresponding to those shown in FIG. 2. PWM controller H is used to convert the input signal into a pulse-width modulated signal in order to drive a load, such as speaker or monitor. As shown in the figure, said PWM controller H has input terminal 5H receiving the input signal, input terminal 6H receiving a reference signal generated as described above, adder 40H, filter (H(s)) 42H, comparator 44H having two inputs, output terminal 7H generating the pulse-width modulated signal output, and feedback circuit (G(s)) 46H. More specifically, for adder 40H having one input connected to input terminal 5H, the other input is connected to the output of feedback circuit 46H. The result of adding the input signal and the feedback signal is generated at the output of the adder. After receiving the output of the adder, filter 42H conducts suitable filtering (transfer function is H(s)) to the signal and then outputs the processed signal. Comparator 44H receives the output of the filter at its non-inverting input and receives the reference signal received at input terminal 6H at its inverting input. The comparator compares the output of the filter with the reference signal to generate the pulse-width modulated signal at output terminal 7H. The pulse-width modulated signal at output terminal 7H is sent to the input of feedback circuit 46H, which generates the feedback signal at its output (transfer function is G(s)). It is preferred that the reference signal received at input terminal 6H be a triangle wave or a sawtooth wave. In the PWM controller H with the aforementioned configuration, since the input signal is PWM modulated using a reference signal with a spread frequency spectrum and the frequency spectrum of the noise component having a notch in the baseband, for the obtained pulse-width modulated signal, as shown in FIG. 8, at (c), the frequency spectrum of the noise component is also spread, and the noise component in the baseband is reduced. When this PWM modulated signal is used, the influence on adjacent circuits or systems can be reduced or eliminated, and the noise in the signal band can be reduced. Also, in this embodiment, by providing a sufficiently high gain to filter 42H, the error in the PWM modulated signal output caused by distortion, etc. in the output can be suppressed by feedback.

Figure 15:
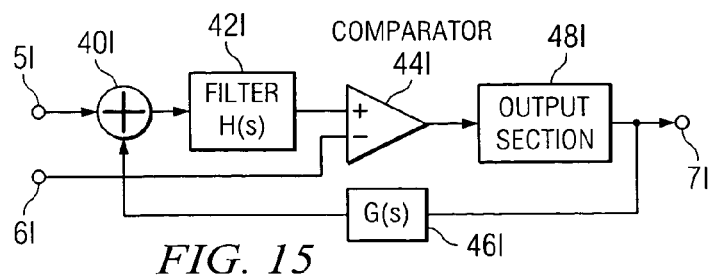
FIG. 15 is a circuit diagram illustrating a PWM controller of another embodiment.

In the following, PWM controller I of another embodiment will be explained based on FIG. 15. In FIG. 15, "I" is appended to the same symbols to represent the elements corresponding to those shown in FIG. 2 or 14. The difference between PWM controller I and the controller shown in FIG. 14 is that output section 48I is added. The rest of the configuration, that is, input terminal 5I receiving input signal, input terminal 6I receiving a reference signal generated as described above, adder 40I, filter (H(s)) zip, comparator 44I having two inputs, output terminal 7I generating the pulse-width modulated signal output, and feedback circuit (G(s)) 46I, is the same. In this embodiment, the input of feedback circuit 46I is connected to the output of output section 46I instead of comparator 44I. In this way, the errors in the PWM modulated signal caused by the distortion, etc., in the output section 46I can be suppressed. The rest of the operation and the advantages are the same as those of the embodiment shown in FIG. 14.

Figure 16:
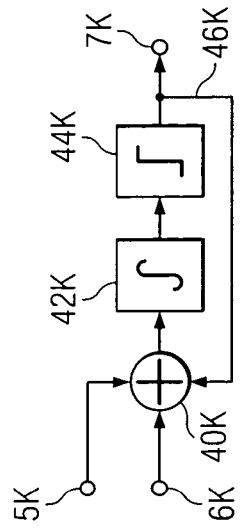
FIG. 16 is a circuit diagram illustrating a PWM controller of yet another embodiment.

In the following, PWM controller J of another embodiment will be explained with reference to FIG. 16. In FIG. 16, "J" is appended to the same symbols to represent the elements corresponding to those shown in FIG. 2 or 14. The difference between PWM controller J and the controller shown in FIG. 14 is that the input signal is not directly compared with the reference signal. Instead, after the input signal and the reference signals as well as the feedback signal are synthesized and filtered, the sign of the signal is determined and the signal is converted into a PWM modulated signal. Consequently, a comparator 44J is used to simply compare the output of the filter with a threshold value (such as zero). Also, input terminal 6J is connected to the input of adder 40J to add the reference value to the input signal and the feedback signal. The rest of the configuration, that is, input terminal 5J receiving input signal, input terminal 6J receiving the reference signal, filter (H(s)) 42J, output terminal 7J generating the pulse-width modulated signal output, and feedback path 46J, is the same. Also, feedback path 46J is simply a connecting wire. However, it is also possible to use the circuit shown in FIG. 14. In the embodiment shown in FIG. 16, the triangle wave reference signal used in the embodiments shown in FIGS. 14 and 15 becomes unnecessary. The square-wave reference signal can be directly supplied to input terminal 6J. Consequently, since the reference signal generator of the digital circuit shown in FIGS. 5 and 6 can be used, the device can be miniaturized, and the cost can be cut.

Figure 17:
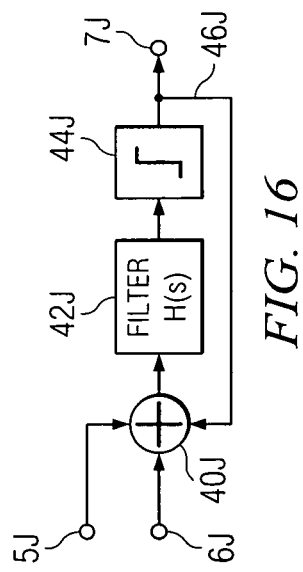
FIG. 17 is a circuit diagram illustrating a PWM controller of yet another embodiment.

In the following, PWM controller K of yet another embodiment will be explained based on FIG. 17. In FIG. 17, "K" is appended to the same symbols to represent the elements corresponding to those shown in FIG. 2 or 16. The difference between PWM controller K and the controller shown in FIG. 16 is that filter 42J is constituted with integrator 42K. The rest of the configuration, that is, input terminal 5K receiving input signal, input terminal 6K receiving the reference signal, adder 40K, comparator 44K, output terminal 7K generating the pulse-width modulated signal output, and feedback path 46K, is the same. In this embodiment, the integrator that constitutes the filter can be easily realized by using an operational amplifier, etc., and a large DC gain can be obtained. If such an integrator is used, the loop gain of the feedback loop can be increased. In this way, the accuracy of the PWM modulated signal output can be further increased. Also, since the square-wave reference signal is converted into a triangle wave by the integrator, the operation is equivalent to inputting the triangle wave to the comparator.

Figure 18:
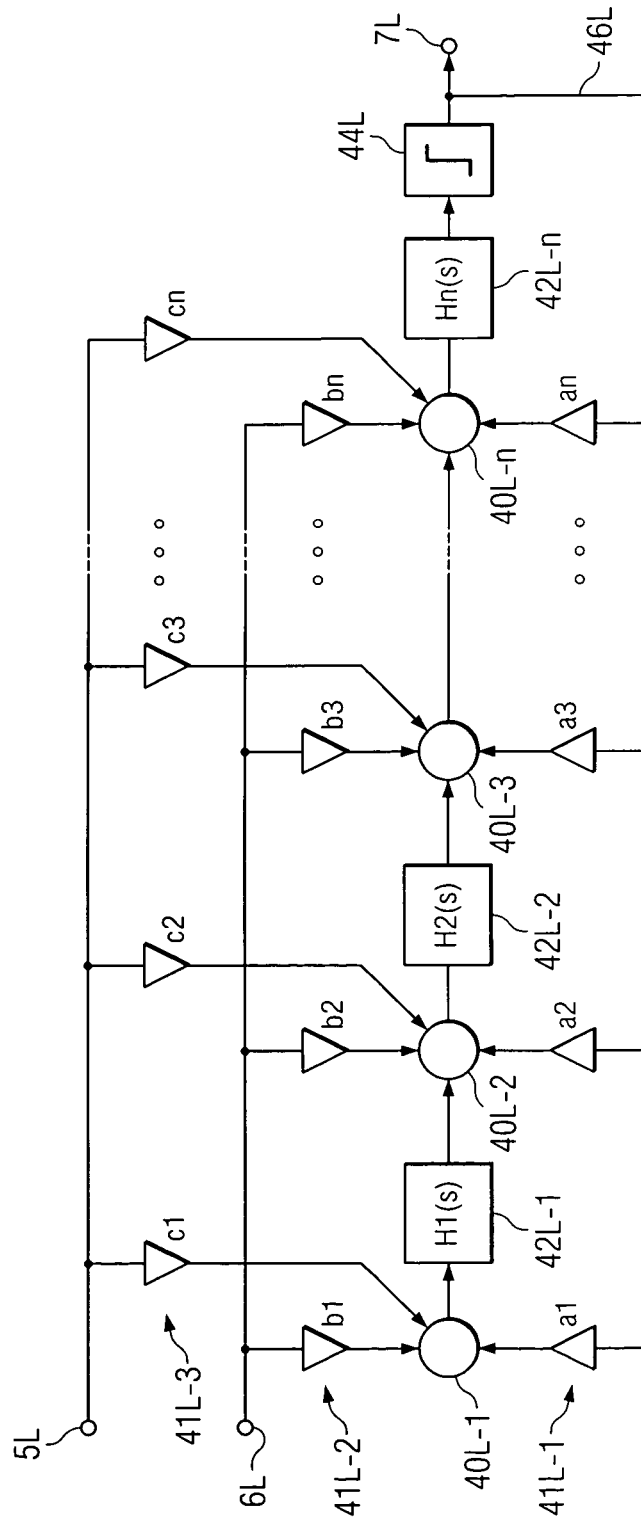
FIG. 18 is a circuit diagram illustrating a PWM controller of yet another embodiment.

In the following, PWM controller L of yet another embodiment will be explained based on FIG. 18. In FIG. 18, "L" is appended to the same symbols to represent the elements corresponding to those shown in FIG. 2 or 16. The difference between PWM controller L and the controller shown in FIG. 16 is that there are plural sections of filter 42J, that is, plural sections of filters 42L-1 to 42L-n are used. Therefore, plural coefficient circuit groups (a1-an, b1-bn, c1-cn) 41L-1 to 41L-3 are used to multiply the coefficients by the input supplied to each filter section, and plural adders 40L-1 to 40L-n are used. The rest of the configuration, that is, input terminal 5L receiving input signal, input terminal 6L receiving the reference signal, comparator 44L, output terminal 7L generating the pulse-width modulated signal output, and feedback path 46L, is the same. More specifically, plural filter sections 42L-1 to 42L-n have transfer functions H1(s)-Hn(s), respectively. Also, the coefficient circuits (ai, bi, ci) included in each of coefficient circuit groups 41L-1 to 41L-3 multiply coefficients ai (i=1-n) by the feedback signal and supply the result to the corresponding adder connected to the input of each filter section, multiply coefficients bi (i=1-n) by the reference signal and supply the result to the corresponding adder, and multiply coefficients ci (i=1-n) by the input signal and supply the result to the corresponding adder. In the PWM controller of this embodiment, since the filter comprises plural sections, the loop gain can be increased compared with that of the embodiments shown in FIGS. 16, 17. In this way, the noise and distortion in the signal band can be reduced. As a result, a highly-accurate Class D amplifier can be constituted using the aforementioned PWM controller. Also, in this embodiment, since plural filters are connected in series, the phase characteristic deteriorates compared with the case of using one filter, and the loop stability is poor. In this embodiment, however, since the poles of the feedback loop can be set as desired to improve the stability of the feedback loop by using coefficient circuits (a1-an), a stable Class D amplifier can be realized.

Figure 19:
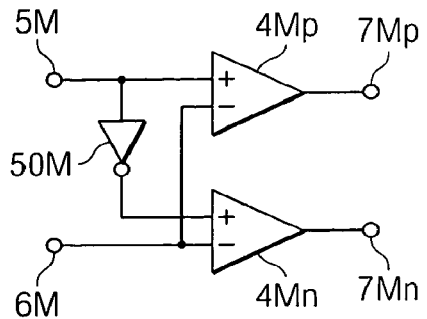
FIG. 19 is a circuit diagram illustrating a PWM controller with a differential configuration that further embodies the embodiment shown in FIG. 14.

PWM controller M with a differential configuration that further embodies the embodiment shown in FIG. 14 will be explained based on FIG. 19. In FIG. 19, "M" is appended to the same symbols to represent the elements corresponding to those shown in FIG. 2. The difference between PWM controller M and the one shown in FIG. 2 is that a pair of PWM modulators 4Mp and 4Mn with a differential configuration are used. Since the input signal is supplied with opposite phase to said pair of PWM modulators 4Mp and 4Mn, input terminal 5M is directly connected to the non-inverting input of PWM modulator 4Mp on the positive side and is connected via an inverter 50M to the non-inverting input of PWM modulator 4Mn on the negative side. Also, since the reference signal is supplied with the same phase to said pair of PWM modulators 4Mp and 4Mn, input terminal 6M is directly connected in the same way to the inverting inputs of both PWM modulators 4Mp and 4Mn. Said pair of PWM modulators 4Mp and 4Mn generate PWM modulated differential output at their outputs. In this embodiment, the signal component supplied with opposite phase is present as a difference signal between the differential outputs of output terminal 7Mp on the positive side and output terminal 7Mn on the negative side. However, the component of the reference signal supplied with the same phase is effectively cancelled and will not appear. Consequently, in the PWM controller of this embodiment, the component other than the input signal, that is, the noise caused by the spectrum spreading, can be reduced significantly. In this way, a highly-accurate Class D amplifier can be constituted.

Figure 20:
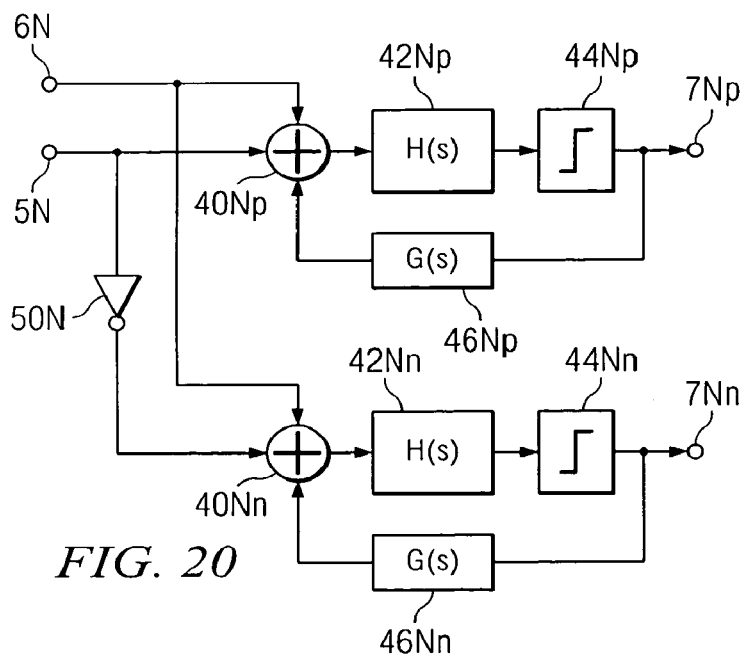
FIG. 20 is a circuit diagram illustrating a PWM controller with a differential configuration that further embodies the embodiment shown in FIG. 19.
Figure 21:
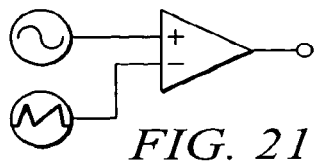
FIG. 21 is a circuit diagram illustrating a conventional pulse-width modulator.
Figure 22:
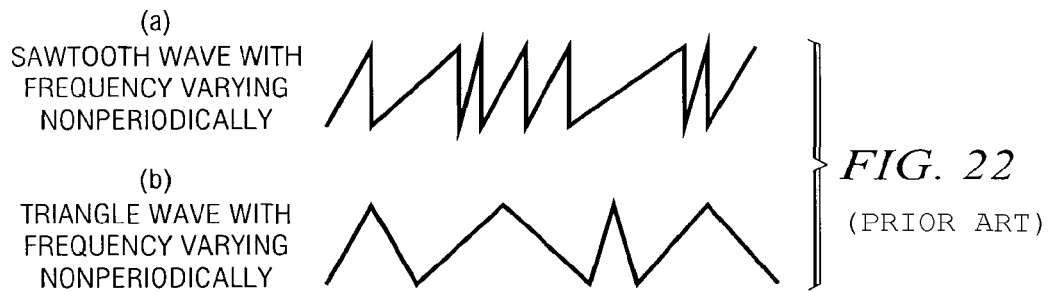
FIG. 22 is a waveform diagram illustrating a triangle wave used in the conventional pulse-width modulator.

In the following, PWM controller N of an embodiment that further details the embodiment shown in FIG. 19 will be explained based on FIG. 20. In FIG. 20, "N" is appended to the same symbols to represent the elements corresponding to those shown in FIG. 19. The difference between PWM controller N and PWM controller J shown in FIG. 16 is that it is formed into a differential configuration according the embodiment shown in FIG. 19. More specifically, adder 40Np receiving input signal from input terminal 5N, the reference signal from input terminal 6N and the feedback signal, filter (H(s)) 42Np, comparator 44Np, output terminal 7Np generating the differential output of the pulse-width modulated signal, and feedback circuit 46Np are used as the circuit equivalent to PWM modulator 4Mp on the positive side. Similarly, adder 40 Nn receiving input signal from input terminal 5N and reference signal from input terminal 6N and the feedback signal, filter (H(s)) 42Nn, comparator 44Nn, output terminal 7Nn generating the differential output of the pulse-width modulated signal, and feedback circuit 46Nn are used as the circuit equivalent of PWM modulator 4Mn on the negative side. Also, the input signal is supplied via inverter 50N to adder 40Nn on the negative side. In PWN controller N of this embodiment, like the embodiment shown in FIG. 16, when a sufficiently high gain is supplied to the filter, the errors in the PWM modulated signal caused by distortion, etc., in the output can be suppressed by feedback. The PWM modulators on the positive and negative sides of the controller shown in FIG. 20 can also be changed to the circuit configuration shown in FIGS. 17, 18.

It is clear to those skilled in the art that the PWM controllers disclosed in the aforementioned various embodiments can also be used in DC-DC converters, AC-AC converters, motor drivers, etc., besides Class D amplifiers.

The invention claimed is:

1. A signal processing apparatus, comprising:
an input for receiving an input signal;
a reference signal generator for generating a reference signal, the generator including a waveform generating circuit for generating a waveform whose frequency varies non-periodically or periodically, and a frequency spectrum distribution shaping circuit configured and adapted for shaping the frequency spectrum distribution of the generated waveform so that there is a reduced spectrum component part in at least one band in the generated reference signal; and
a pulse-width modulator coupled to the input and reference signal generator, the modulator being configured and adapted for spreading the spectrum of the input signal and generating a PWM output signal having a reduced spectrum component part in the at least one band by PWM-modulating the input signal based on the generated reference signal.

2. The signal processing apparatus as in claim 1, wherein the input signal received at the input comprises first and second differential signals; said pulse-width modulator has first and second pulse-width modulator parts, said pulse-width modulator first part being configured and adapted to receive said first differential input signal and generate a first differential PWM modulation output signal, and said second pulse-width modulator part being configured and adapted to receive said second differential input signal and generate a second differential PWM modulation output signal; the first and second differential PWM modulation output signals forming a differential output signal.

3. The signal processing apparatus as in claim 1, wherein the waveform generating circuit comprises a clock generator for generating a clock signal, and a PN code generator coupled to receive the clock signal generated by said clock generator and configured and adapted to generate a PN code based thereon; and wherein said frequency spectrum distribution shaping circuit comprises a logic circuit coupled to receive the clock signal and the PN signal, and configured and adapted to compare the clock signal and PN code to generate the reference signal.

4. The signal processing apparatus as in claim 3, wherein said waveform generating circuit includes a frequency divider that divides the frequency of the clock signal generated by said clock generator before the clock signal is received by said PN code generator.

5. The signal processing apparatus as in claim 4, wherein said logic circuit comprises an exclusive OR gate.

6. The signal processing apparatus as in claim 1, wherein said pulse-width modulator includes a filter coupled and configured to receive the input signal, filter the input signal, and provide a filtered version of the input signal as an output; and a comparator coupled to receive the filtered input signal and compare the filtered input signal to the reference signal.

7. The signal processing apparatus as in claim 6, wherein said pulse-width modulator includes a feedback circuit from the output to an input of the filter.

8. The signal processing apparatus as in claim 1, wherein said pulse-width modulator comprises an adder configured and adapted for adding the input signal and the reference signal, and coupled to pass the added input and reference signals to a filter; and a comparator is coupled, configured and adapted to compare the output of the filter to a threshold value to generate the pulse-width modulated signal.

9. The signal processing apparatus as in claim 8, wherein said adder and filter of said pulse-width modulator have multiple adder/filter sections, and each of the adder/filter sections is coupled to receive the input signal and the reference signal as inputs.

10. The signal processing apparatus as in claim 1 is embodied in a Class D amplifier.

* * * * *